(12) United States Patent
Komatsu et al.

(10) Patent No.: US 9,576,948 B2
(45) Date of Patent: Feb. 21, 2017

(54) SEMICONDUCTOR DEVICE

(71) Applicant: Kabushiki Kaisha Toshiba, Minato-ku, Tokyo (JP)

(72) Inventors: Kanako Komatsu, Yokohama Kanagawa (JP); Keita Takahashi, Yokohama Kanagawa (JP); Masahiro Inohara, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/747,183

(22) Filed: Jun. 23, 2015

(65) Prior Publication Data

US 2015/0380546 A1 Dec. 31, 2015

(30) Foreign Application Priority Data

Jun. 27, 2014 (JP) ................................. 2014-132627
Jun. 2, 2015 (JP) ................................. 2015-112158

(51) Int. Cl.
*H01L 27/02* (2006.01)
*H01L 27/06* (2006.01)
*H01L 27/088* (2006.01)
*H01L 29/10* (2006.01)
*H01L 29/78* (2006.01)
*H01L 29/08* (2006.01)
*H01L 21/8234* (2006.01)
*H01L 29/06* (2006.01)

(52) U.S. Cl.
CPC ....... *H01L 27/0629* (2013.01); *H01L 27/0207* (2013.01); *H01L 27/088* (2013.01); *H01L 29/0692* (2013.01); *H01L 29/0847* (2013.01); *H01L 29/1095* (2013.01); *H01L 29/7835* (2013.01); *H01L 21/823425* (2013.01); *H01L 27/0266* (2013.01); *H01L 29/0653* (2013.01); *H01L 29/1045* (2013.01)

(58) Field of Classification Search
CPC ............... H01L 27/0266; H01L 27/027; H01L 27/0281; H01L 21/823418; H01L 21/823425; H01L 29/7801
See application file for complete search history.

(56) References Cited

U.S. PATENT DOCUMENTS

| | | | |
|---|---|---|---|
| 6,215,138 B1 | 4/2001 | Takao | |
| 8,362,554 B2 | 1/2013 | Matsudai et al. | |
| 2010/0127321 A1* | 5/2010 | Ko | H01L 29/0653 257/327 |
| 2011/0068406 A1 | 3/2011 | Yasuhara et al. | |
| 2012/0018804 A1* | 1/2012 | Khemka | H01L 29/1083 257/337 |

* cited by examiner

*Primary Examiner* — Davienne Monbleau
*Assistant Examiner* — Leslie Pilar Cruz
(74) *Attorney, Agent, or Firm* — White & Case LLP

(57) ABSTRACT

A semiconductor device includes a first and second transistor. Each of the first and the second transistors includes a well of a first conductivity type, a band-shaped region provided on the well, a drain region of a second conductivity type provided on the well, and a gate electrode. The band-shaped region, the drain region and the gate electrode extend in a first direction. The band-shaped region includes a back gate region of the first conductivity type and a source region of the second conductivity type. The back gate region and the source region are arranged alternately along the first direction in the band-shaped region. A ratio of a length of the source region to a length of the back gate region along the first direction of the first transistor is greater than the ratio of the second transistor.

18 Claims, 7 Drawing Sheets

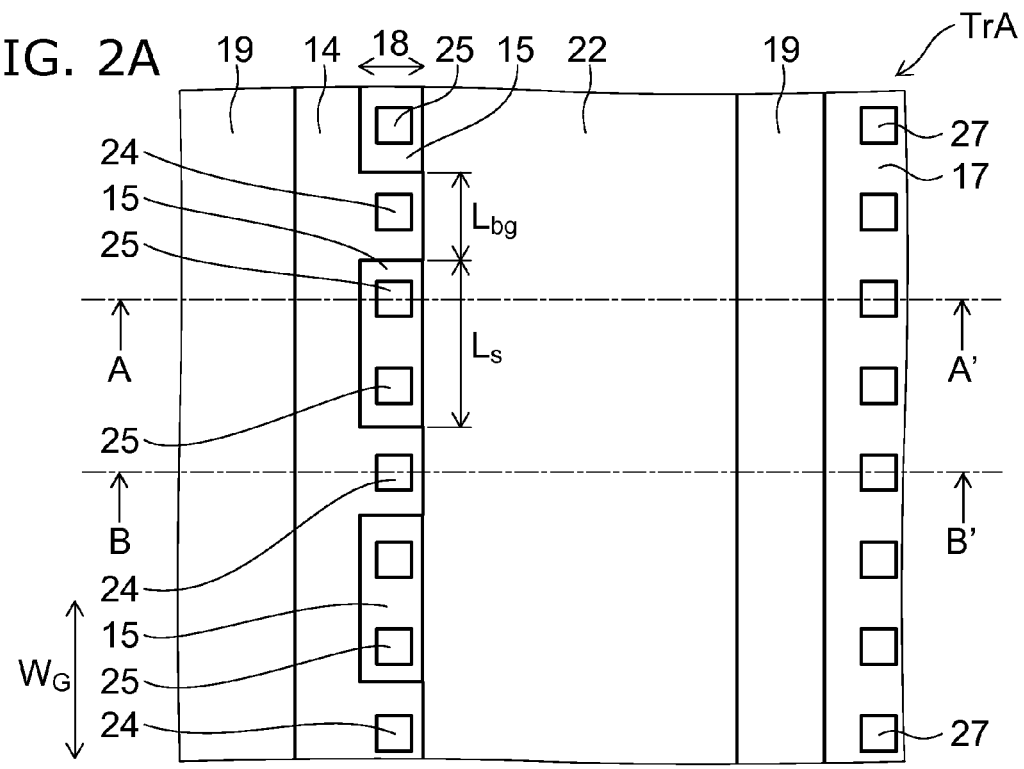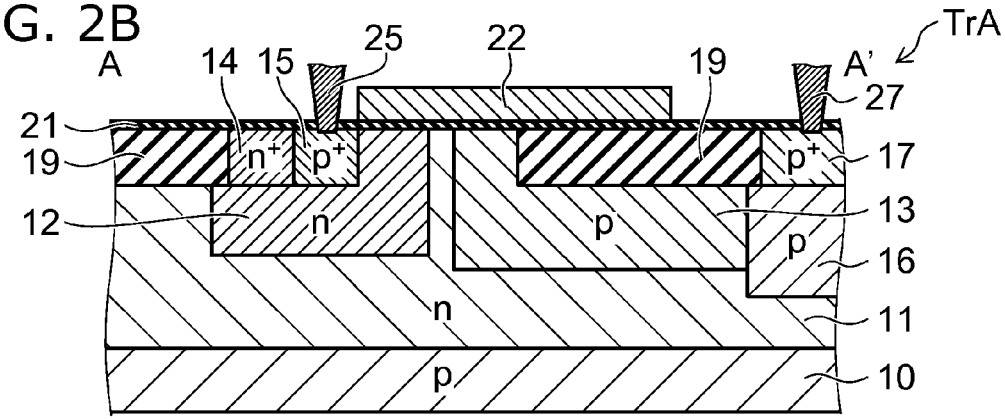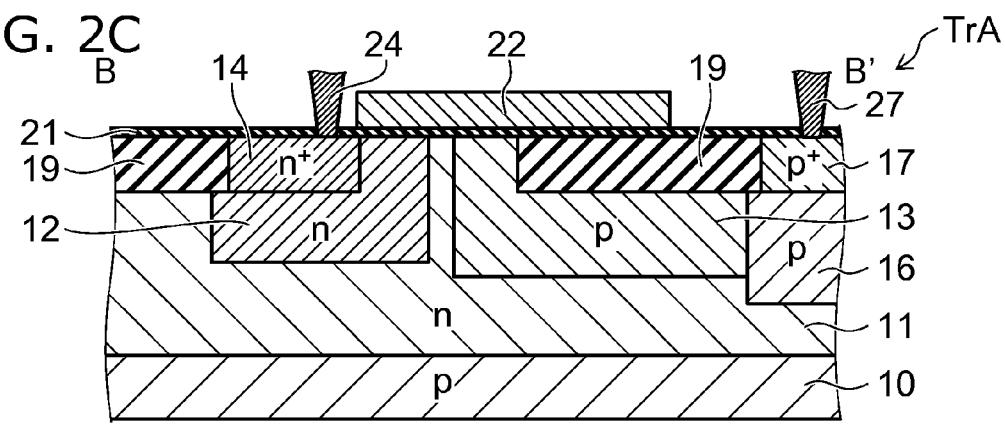

SEMICONDUCTOR DEVICE

CROSS-REFERENCE TO RELATED APPLICATIONS

This application is based upon and claims the benefit of priority from Japanese Patent Application No. 2014-132627, filed on Jun. 27, 2014, and Japanese Patent Application No. 2015-112158, filed on Jun. 2, 2015; the entire contents of which are incorporated herein by reference.

FIELD

Embodiments described herein relate to a semiconductor device.

BACKGROUND

Many transistors are formed on a silicon substrate in a semiconductor device having a built-in analog circuit. Even inside the same analog circuit, different characteristics are necessary for the transistors according to the position on the circuit and the operating conditions of the individual circuit.

BRIEF DESCRIPTION OF THE DRAWINGS

FIG. 2A is a top view showing a low on-resistance transistor; FIG. 2B is a cross-sectional view along line A-A' of FIG. 2A; and FIG. 2C is a cross-sectional view along line B-B' of FIG. 2A;

DETAILED DESCRIPTION

A semiconductor device according one embodiment includes a substrate, a first transistor provided on the substrate and a second transistor provided on the substrate. Each of the first transistor and the second transistor includes a well of a first conductivity type, a band-shaped region provided on the well, a drain region of a second conductivity type, a gate electrode provided in a region directly on a region of the well between the band-shaped region and the drain region. The band-shaped region extends in a first direction. The drain region is provided on the well and separated from the band-shaped region. The drain region extends in the first direction. The gate electrode extends in the first direction. The band-shaped region includes a back gate region of the first conductivity type and a source region of the second conductivity type. An effective impurity concentration of the back gate region is higher than an effective impurity concentration of the well. An effective impurity concentration in the source region is higher than the effective impurity concentration of the well. The back gate region and the source region are arranged alternately along the first direction in the band-shaped region. A ratio of a length of the source region along the first direction to a length of the back gate region along the first direction in the band-shaped region of the first transistor is greater than the ratio in the band-shaped region of the second transistor.

Embodiments of the invention will now be described with reference to the drawings.

First Embodiment

First, a first embodiment will be described.

Figure 1:
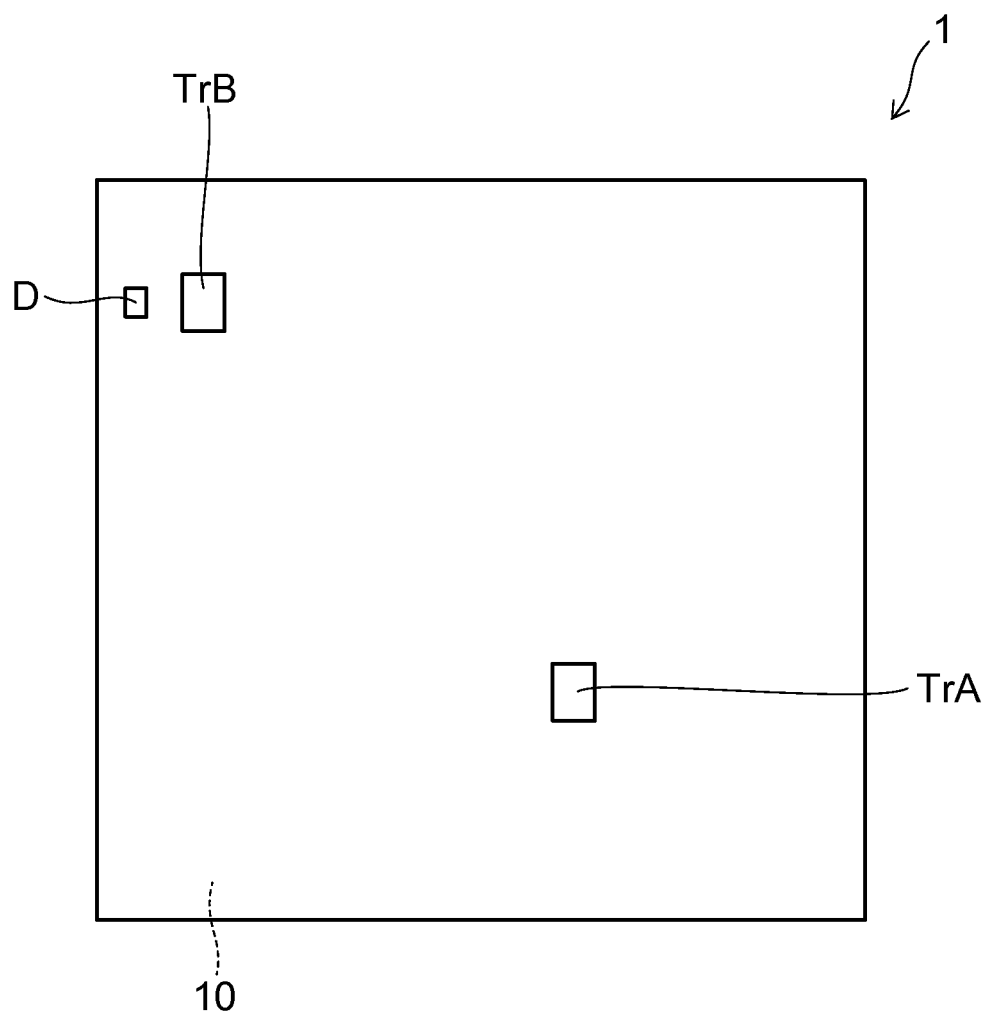
FIG. 1 is a top view showing a semiconductor device according to a first embodiment.

FIG. 1 is a top view showing a semiconductor device according to the embodiment.

FIG. 2A is a top view showing a low on-resistance transistor; FIG. 2B is a cross-sectional view along line A-A' of FIG. 2A; and FIG. 2C is a cross-sectional view along line B-B' of FIG. 2A.

Figure 3A:
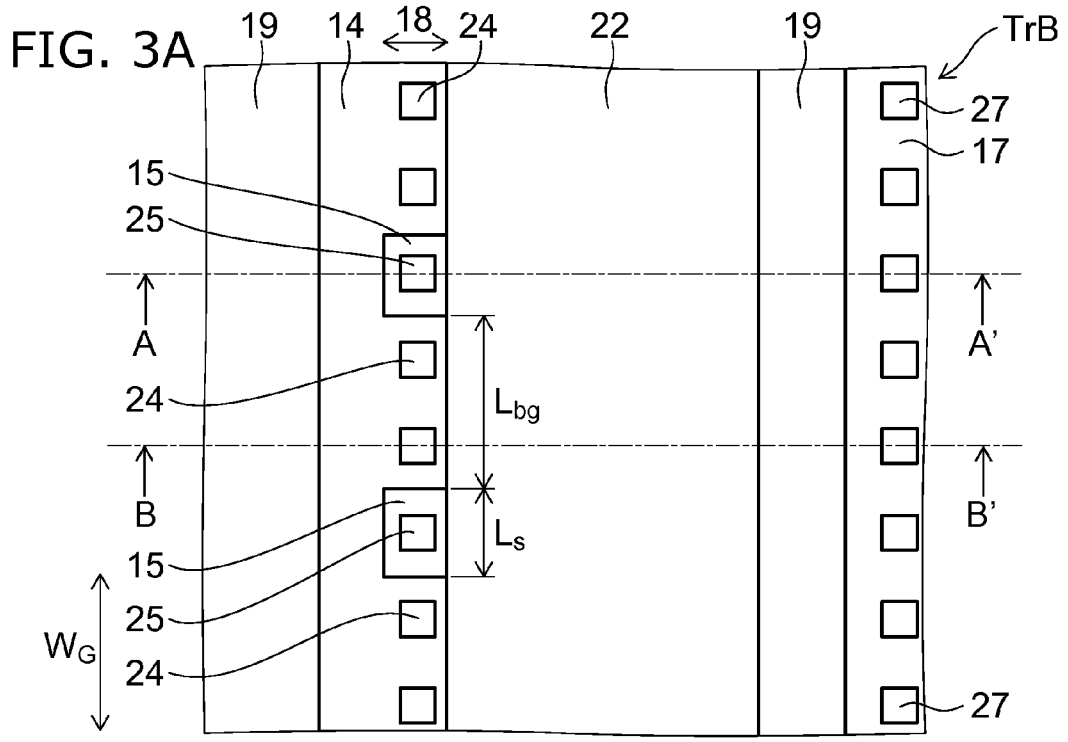
FIG. 3A is a top view showing a high ESD (Electrostatic Discharge) protection transistor.
Figure 3B:
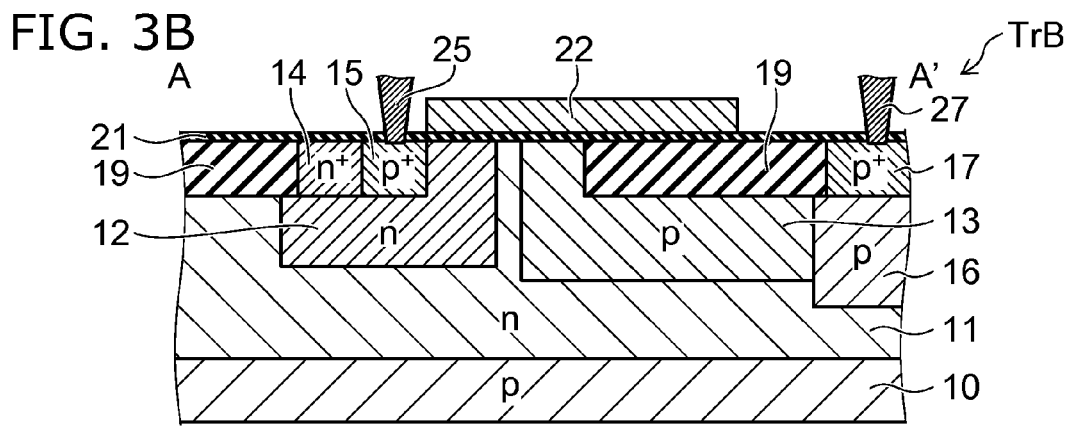
FIG. 3B is a cross-sectional view along line A-A' of FIG. 3A.
Figure 3C:
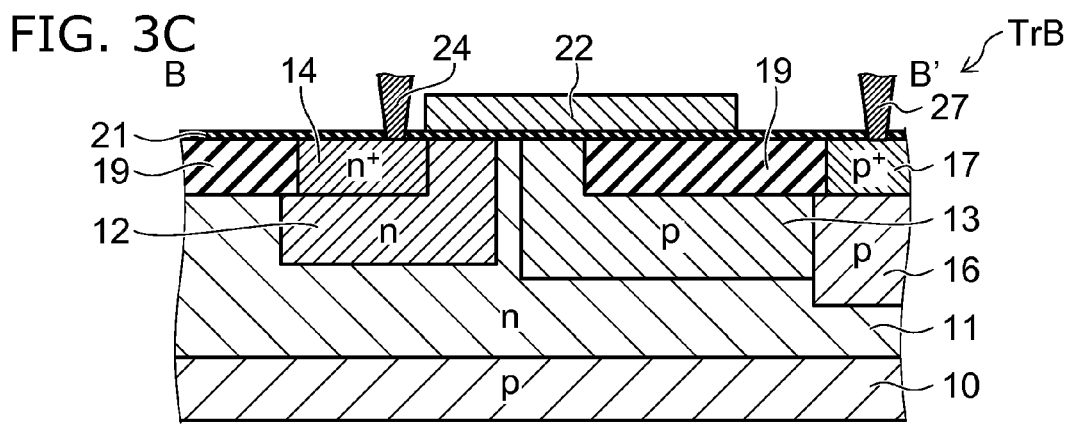
FIG. 3C is a cross-sectional view along line B-B' of FIG. 3A.

FIG. 3A is a top view showing a high ESD (Electrostatic Discharge) protection transistor; FIG. 3B is a cross-sectional view along line A-A' of FIG. 3A; and FIG. 3C is a cross-sectional view along line B-B' of FIG. 3A.

In the specification, the "$n^+$-type" means that the conductivity type is the n-type and the effective impurity concentration is higher than that of the "n-type." Similarly, the "$p^+$-type" means that the conductivity type is the p-type and the effective impurity concentration is higher than that of the "p-type." The "effective impurity concentration" refers to the concentration of the impurities contributing to the conduction of the semiconductor material, and in the case where both an impurity that forms donors and an impurity that forms acceptors are contained in the semiconductor material, refers to the portion of the concentration excluding the cancelled portion of the donors and the acceptors.

In the semiconductor device 1 according to the embodiment as shown in FIG. 1, a low on-resistance transistor TrA and a high ESD protection transistor TrB are provided on a p-type silicon substrate 10. The low on-resistance transistor TrA and the high ESD protection transistor TrB are arranged at mutually-separated positions and are electrically isolated from each other. A pad D is provided at the vicinity of the high ESD protection transistor TrB and is connected to the source of the high ESD protection transistor TrB. For example, the low on-resistance transistor TrA is disposed at the central portion of a chip included in the semiconductor device 1; and the high ESD protection transistor TrB is disposed at the peripheral portion of the chip.

In the semiconductor device 1, a circuit that includes the low on-resistance transistor TrA, the high ESD protection transistor TrB, and the pad D is formed on the silicon substrate 10. As described below, the low on-resistance transistor TrA and the high ESD protection transistor TrB are DMOS (Double-Diffused Metal-Oxide-Semiconductor) field-effect transistors. The semiconductor device 1 is, for example, an analog circuit, e.g., a power supply circuit or an audio circuit.

The configuration of the low on-resistance transistor TrA will now be described.

In the low on-resistance transistor TrA as shown in FIGS. 2A to 2C, a deep n-well 11 is provided on the silicon substrate 10. An n-type well 12 and a p-type drift region 13 are provided in the upper layer portion of the deep n-well 11 to be separated from each other. The n-type well 12 and the p-type drift region 13 may contact each other. The n-type well 12 and the p-type drift region 13 extend in a gate width direction $W_G$ of the low on-resistance transistor TrA.

An $n^+$-type back gate region 14 is provided in the upper layer portion of the n-type well 12. When viewed from above, the configuration of the $n^+$-type back gate region 14 is a comb-shaped configuration extending in the gate width direction $W_G$ and having comb teeth on the p-type drift region 13 side; and a $p^+$-type source region 15 is provided in island configurations in the regions between the comb teeth of the $n^+$-type back gate region 14. The $p^+$-type source region 15 contacts the $n^+$-type back gate region 14. Thereby, the $p^+$-type source regions 15 and the comb teeth portions of the $n^+$-type back gate region 14 are arranged alternately in one column to form a band-shaped region 18 extending in the gate width direction $W_G$. In the band-shaped region 18, the value ($L_s/L_{bg}$) of the ratio of a length $L_s$ of each $p^+$-type source region 15 in the gate width direction $W_G$ to a length $L_{bg}$ of each $n^+$-type back gate region 14 in the gate width direction $W_G$ is, for example, a value not less than 1 and not more than 9, e.g., about 2.

On the other hand, a p-type well 16 that extends in the gate width direction $W_G$ is provided on the side of the p-type drift region 13 distal to the n-type well 12 as viewed from the p-type drift region 13. The p-type well 16 contacts the p-type drift region 13. A $p^+$-type drain region 17 that extends in the gate width direction $W_G$ is provided on the p-type well 16.

A STI (Shallow Trench Isolation (element-separating insulating film)) 19 is provided in the region of the upper layer portion of the n-type well 12 that is separated more from the p-type drift region 13 than is the $n^+$-type back gate region 14, in the upper layer portion of the deep n-well 11 continuing from this region, and in the upper layer portion of the portion of the p-type drift region 13 other than the end portion opposing the n-type well 12. In other words, the STI 19 is provided between the $p^+$-type drain region 17 and the band-shaped region 18, contacts the $p^+$-type drain region 17, but does not contact the band-shaped region 18. When viewed from above, the region not covered with the STI 19 other than the $p^+$-type drain region 17 is called the active area.

A gate insulator film 21 is provided on the portions of the n-type well 12 and the p-type drift region 13 that oppose each other; and a gate electrode 22 that extends in the gate width direction $W_G$ is provided on the gate insulator film 21. The gate insulator film 21 is not shown in FIG. 2A. A back gate contact 24 is provided on the $n^+$-type back gate region 14 and connected to the $n^+$-type back gate region 14. A source contact 25 is provided on the $p^+$-type source region 15 and connected to the $p^+$-type source region 15. A drain contact 27 is provided on the $p^+$-type drain region 17 and connected to the $p^+$-type drain region 17.

The configuration of the high ESD protection transistor TrB will now be described.

As shown in FIGS. 3A to 3C, compared to the configuration of the low on-resistance transistor TrA, the configuration of the high ESD protection transistor TrB differs in that the value ($L_s/L_{bg}$) of the ratio of the length $L_s$ in the gate width direction $W_G$ of the $p^+$-type source region 15 to the length $L_{bg}$ in the gate width direction $W_G$ of the comb tooth portion of the $n^+$-type back gate region 14 is small. The value ($L_s/L_{bg}$) of the ratio of the high ESD protection transistor TrB is, for example, a value not less than 0.1 but less than 1, e.g., about 0.2.

In other words, the surface area of the $p^+$-type source region 15 is relatively large in the low on-resistance transistor TrA; but the surface area of the $n^+$-type back gate region 14 is relatively large in the high ESD protection transistor TrB. In other words, the value of the ratio of the surface area of the $p^+$-type source region 15 to the surface area of the $n^+$-type back gate region 14 in the low on-resistance transistor TrA is greater than the value of the surface area ratio in the high ESD protection transistor TrB. The deep n-well 11 of the high ESD protection transistor TrB is separated from the deep n-well 11 of the low on-resistance transistor TrA. The source contact 25 of the high ESD protection transistor TrB is connected directly, that is, not via an active element such as a transistor or the like, to the pad D (referring to FIG. 1).

Effects of the embodiment will now be described.

In the low on-resistance transistor TrA of the semiconductor device 1 according to the embodiment, the value ($L_s/L_{bg}$) of the ratio in the gate width direction $W_G$ is relatively large; and the surface area of the $p^+$-type source region 15 is relatively large. Thereby, the on-resistance can be reduced. The low on-resistance transistor TrA can be used favorably in applications in which a lower on-resistance is more important than ESD protection performance, e.g., in a switching element that switches at high speed.

On the other hand, in the high ESD protection transistor TrB, the value ($L_s/L_{bg}$) of the ratio is relatively small; and the surface area of the $n^+$-type back gate region 14 is relatively large. Thereby, the ESD protection performance can be increased. The high ESD protection transistor TrB can be used favorably in applications in which the ESD protection performance is more important than the on-resistance, e.g., a gate circuit in which a current is input directly from the outside via the pad D.

Thus, according to the embodiment, the low on-resistance transistor TrA that has a low on-resistance and the high ESD protection transistor TrB that has high ESD protection performance can be individually made on the same substrate; and more favorable transistors can be used according to the characteristics necessary for the position on the circuit and the operating conditions of the individual circuit. As a result, a high-performance semiconductor device 1 can be obtained. Also, the low on-resistance transistor TrA and the high ESD protection transistor TrB can be individually made by merely modifying the layout of the $n^+$-type back gate region 14 and the $p^+$-type source region 15; and it is unnecessary to modify the layout of the other portions. Therefore, the design of the semiconductor device 1 is easy.

It also may be considered to improve the ESD protection performance of the high ESD protection transistor TrB by making the depth of the $n^+$-type back gate region 14 deeper while maintaining the value ($L_s/L_{bg}$) of the ratio at the same value as the low on-resistance transistor TrA. However, in such a case, the surface area of the high ESD protection transistor TrB increases; and the downsizing of the semiconductor device 1 is obstructed. Conversely, according to the embodiment, the ESD protection performance can be improved without increasing the surface area of the high ESD protection transistor TrB by setting the value ($L_s/L_{bg}$)

of the ratio to be relatively small. As a result, the downsizing of the semiconductor device 1 is easy.

Second Embodiment

A second embodiment will now be described.

Figures 4A, 4B:
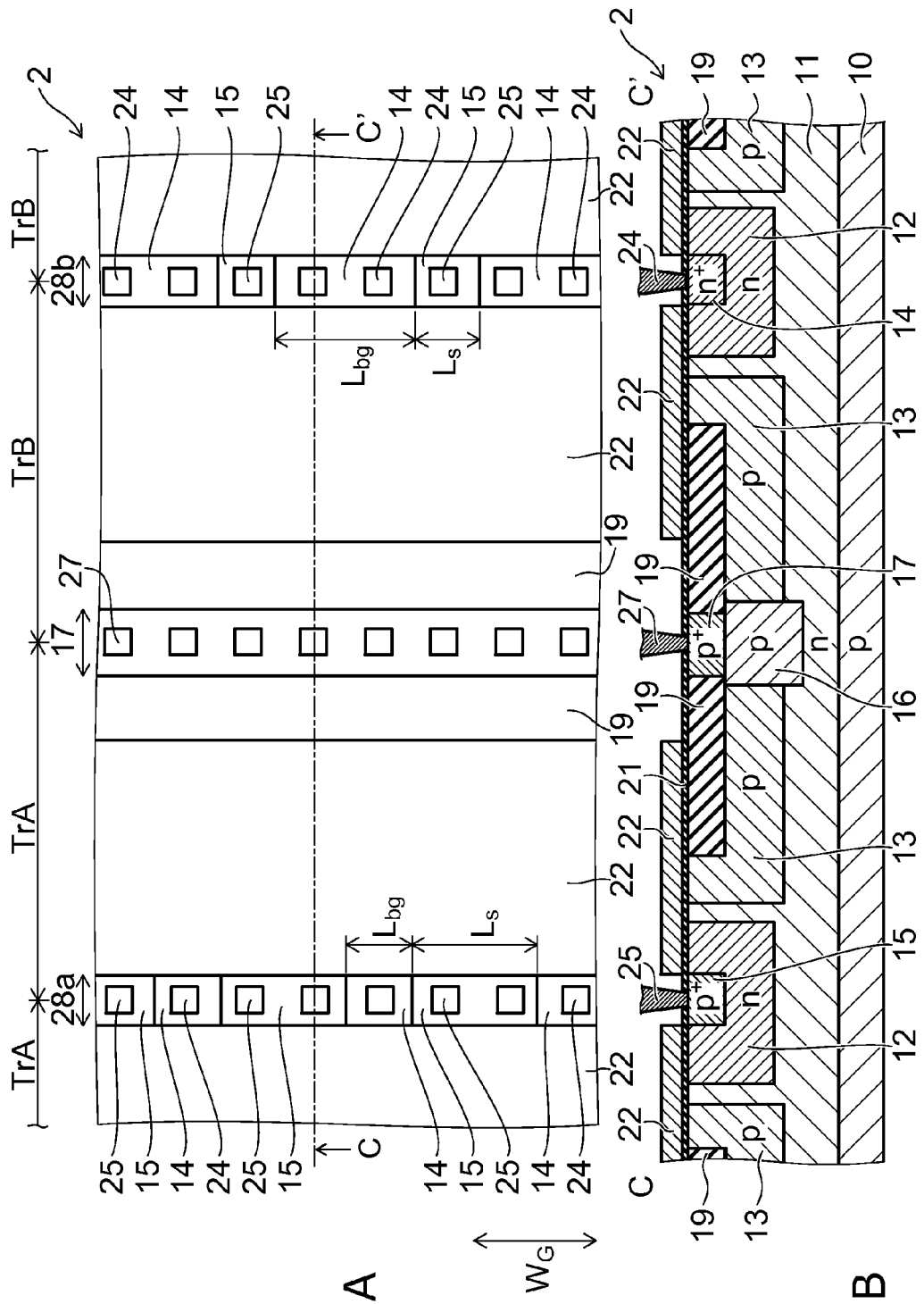
FIG. 4A is a top view showing a semiconductor device according to a second embodiment.
FIG. 4B is a cross-sectional view along line C-C' shown in FIG. 4A.

FIG. 4A is a top view showing a semiconductor device according to the embodiment; and FIG. 4B is a cross-sectional view along line C-C' shown in FIG. 4A.

In the semiconductor device 2 according to the embodiment as shown in FIGS. 4A and 4B, the low on-resistance transistor TrA and the high ESD protection transistor TrB share the p$^+$-type drain region 17 and are arranged along the gate-length direction. In other words, in the semiconductor device 2, the deep n-well 11 is provided on the silicon substrate 10; and the p$^+$-type drain region 17 that has a band configuration extending in the gate width direction $W_G$ is arranged alternately with band-shaped regions 28a and 28b on the deep n-well 11, where the band-shaped regions 28a and 28b include the n$^+$-type back gate region 14 and the p$^+$-type source region 15 arranged alternately along the gate width direction $W_G$. The value ($L_s/L_{bg}$) of the ratio is different between the two band-shaped regions 28a and 28b having one interposed p$^+$-type drain region 17.

Specifically, the value ($L_s/L_{bg}$) of the ratio in the band-shaped region 28a is relatively large; and the value ($L_s/L_{bg}$) of the ratio in the band-shaped region 28b is relatively small. Thereby, the low on-resistance transistor TrA that includes the band-shaped region 28a and the high ESD protection transistor TrB that includes the band-shaped region 28b are arranged to share the p$^+$-type drain region 17. As a result, in the semiconductor device 2, two low on-resistance transistors TrA that share the band-shaped region 28a and two high ESD protection transistors TrB that share the band-shaped region 28b share one p$^+$-type drain region 17 and are arranged on two sides of the one p$^+$-type drain region 17.

Otherwise, the configuration of the embodiment is similar to that of the first embodiment described above. In other words, the STI 19 is provided on two sides of the p$^+$-type drain region 17. The p-type well 16 is provided between the p$^+$-type drain region 17 and the deep n-well 11. The p-type drift region 13 is provided between the STI 19 and the deep n-well 11. The p-type drift region 13 contacts the p-type well 16. On the other hand, the n-type well 12 is provided to cover the lower surface and the side surface of the band-shaped regions 28a and 28b. The n-type well 12 does not contact the p-type drift region 13; and a portion of the deep n-well 11 is interposed between the n-type well 12 and the p-type drift region 13. The gate insulator film 21 and the gate electrode 22 are provided in the region directly on the opposing portions of the n-type well 12 and the p-type drift region 13. These components extend in the gate width direction $W_G$.

Effects of the embodiment will now be described.

In the embodiment, the low on-resistance transistor TrA and the high ESD protection transistor TrB can be provided together inside one transistor region. As a result, for example, in the case where damage by ESD occurs easily at the edge portion of the transistor region, the entire transistor region can be operated at a low on-resistance while avoiding the damage due to ESD by disposing the high ESD protection transistor TrB at the edge portion of the transistor region and disposing the low on-resistance transistor TrA at the central portion. Otherwise, the effects of the embodiment are similar to those of the first embodiment described above.

Third Embodiment

A third embodiment will now be described.

Figure 5A:
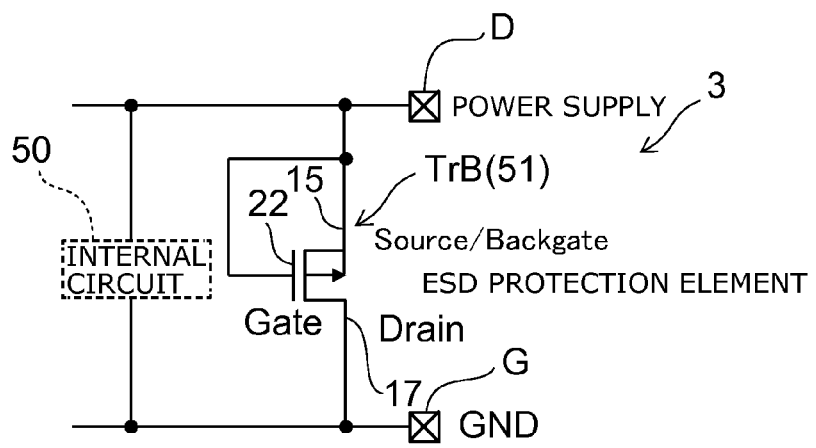
FIG. 5A is a circuit diagram showing a semiconductor device according to a third embodiment.
Figure 5B:
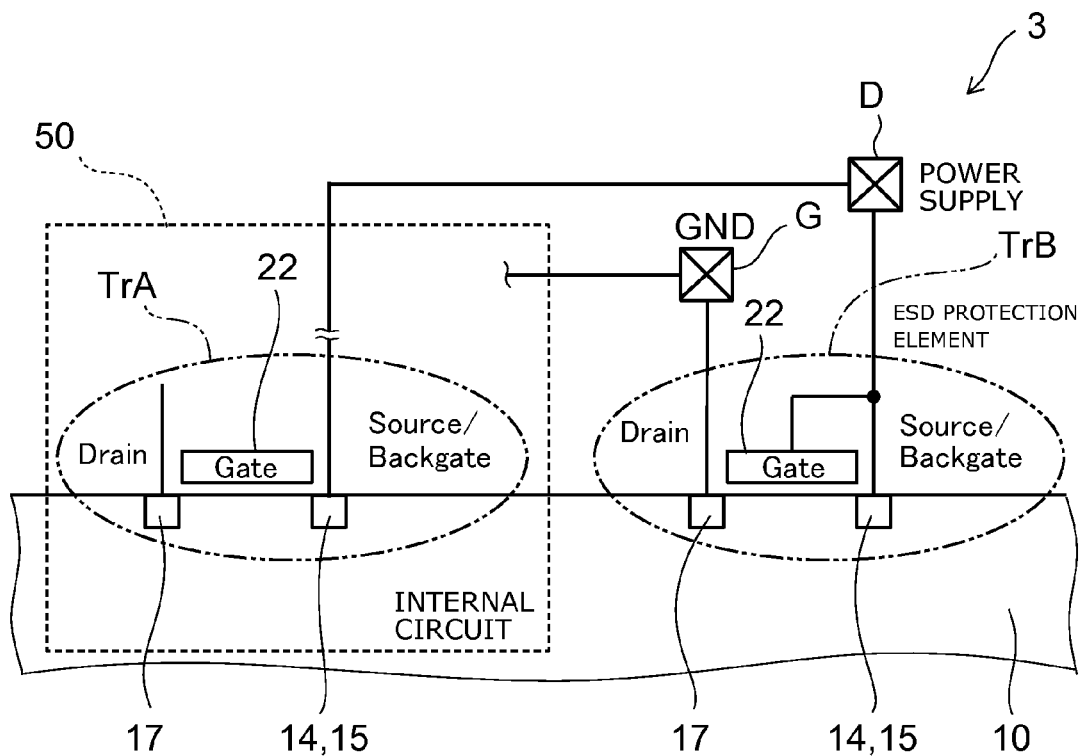
FIG. 5B is a schematic cross-sectional view showing the semiconductor device according to the third embodiment.

FIG. 5A is a circuit diagram showing a semiconductor device according to the embodiment; and FIG. 5B is a schematic cross-sectional view showing the semiconductor device according to the embodiment.

As shown in FIGS. 5A and 5B, an internal circuit 50, an ESD protection element 51, the pad D, and a pad G are provided in the semiconductor device 3 according to the embodiment. The pad D is a pad to which a positive power supply potential is applied; and the pad G is a pad to which the ground potential is applied. The internal circuit 50 and the ESD protection element 51 are connected in parallel between the pad D and the pad G. The deep n-well 11, the n-type well 12, the p-type drift region 13, the STI 19, etc., are included inside the silicon substrate 10; and FIG. 5B is simplified. This is similar for FIG. 6B as well.

The internal circuit 50 is a circuit that performs the original function of the semiconductor device 3 and is, for example, a power supply circuit or an audio circuit. The low on-resistance transistor TrA is included in the internal circuit 50. The n$^+$-type back gate region 14 and the p$^+$-type source region 15 of the low on-resistance transistor TrA are connected to the pad D directly or indirectly. "Directly connected" means being connected without an active element such as a transistor or the like interposed; and "indirectly connected" means being connected with at least one active element interposed.

The ESD protection element 51 is an element for protecting the internal circuit 50 from ESD. The high ESD protection transistor TrB is included in the ESD protection element 51. The p$^+$-type source region 15 and the gate electrode 22 of the high ESD protection transistor TrB are shorted to each other by, for example, a metal interconnect provided on the silicon substrate 10. The resistance value between the p$^+$-type source region 15 and the gate electrode 22 is, for example, 20Ω or less, e.g., about 1Ω. The p$^+$-type drain region 17 of the high ESD protection transistor TrB is, for example, directly connected to the pad G; and the n$^+$-type back gate region 14, the p$^+$-type source region 15, and the gate electrode 22 are, for example, directly connected to the pad D.

Other than the source and the gate of the high ESD protection transistor TrB being shorted, the configurations of the low on-resistance transistor TrA and the high ESD protection transistor TrB of the embodiment are similar to those of the first embodiment described above. The low on-resistance transistor TrA and the high ESD protection transistor TrB are formed in the same silicon substrate 10.

The operations of the semiconductor device according to the embodiment will now be described.

First, a normal operation will be described.

In the high ESD protection transistor TrB as shown in FIGS. 5A and 5B, a positive power supply potential is applied to the p$^+$-type source region 15 via the pad D; and the ground potential is applied to the p$^+$-type drain region 17 via the pad G. Therefore, a depletion layer spreads from the interface between the deep n-well 11 and the p-type drift region 13 as a starting point. Because the positive power supply potential is applied to the gate electrode 22 via the pad D, an inversion layer is not formed in the deep n-well 11 and the n-type well 12. Therefore, the high ESD protection transistor TrB is in the off-state.

The operation when ESD is applied to the semiconductor device 3 will now be described.

When positive ESD is applied to the pad D, the interface between the deep n-well 11 and the p-type drift region 13 breaks down and allows the ESD current to flow. Thereby, the internal circuit 50 is protected from ESD. When positive ESD is applied to the pad G, the ESD current flows without breakdown because the interface between the deep n-well 11 and the p-type drift region 13 is a forward junction.

Effects of the embodiment will now be described.

According to the embodiment, the internal circuit 50 can be protected from ESD by the ESD protection element 51 by connecting the internal circuit 50 and the ESD protection element 51 in parallel between the power supply potential and the ground potential. Also, by providing the high ESD protection transistor TrB in the ESD protection element 51 and shorting the source and the gate of the high ESD protection transistor TrB, a positive power supply potential is applied constantly to the gate electrode 22; and the high ESD protection transistor TrB can be reliably caused to be in the off-state. As a result, leakage current via the high ESD protection transistor TrB can be suppressed.

Otherwise, the configuration, the operations, and the effects of the embodiment are similar to those of the first embodiment described above.

Fourth Embodiment

A fourth embodiment will now be described.

Figure 6A:
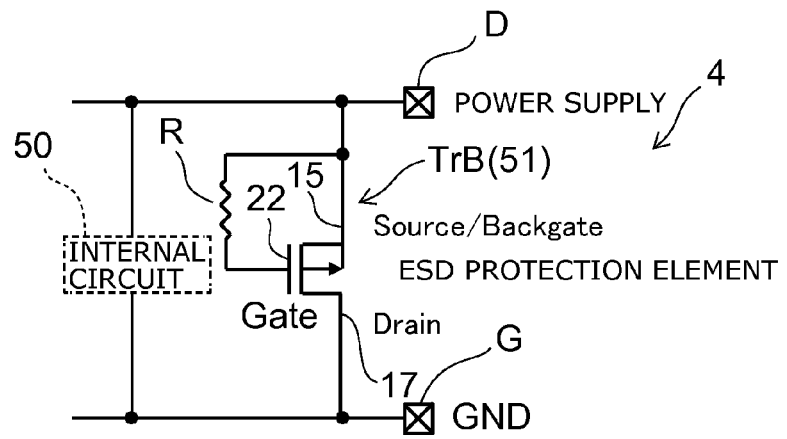
FIG. 6A is a circuit diagram showing a semiconductor device according to a fourth embodiment.
Figure 6B:
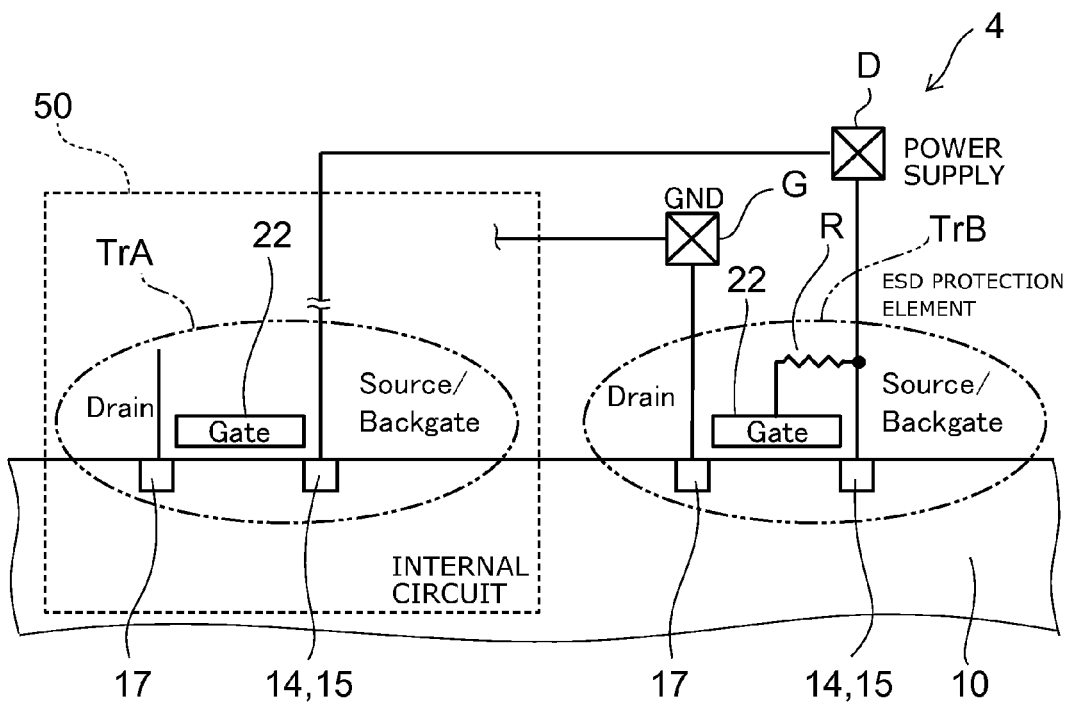
FIG. 6B is a schematic cross-sectional view showing the semiconductor device according to the fourth embodiment.

FIG. 6A is a circuit diagram showing a semiconductor device according to the embodiment; and FIG. 6B is a schematic cross-sectional view showing the semiconductor device according to the embodiment.

As shown in FIGS. 6A and 6B, compared to the semiconductor device 3 according to the third embodiment described above (referring to FIGS. 5A and 5B), the semiconductor device 4 according to the embodiment differs in that a resistor R is connected between the p$^+$-type source region 15 and the gate electrode 22 of the high ESD protection transistor TrB. Because the pad D is connected to the p$^+$-type source region 15, the resistor R is interposed between the pad D and the gate electrode 22. The resistor R is, for example, a resistor formed of polysilicon and is provided on the silicon substrate 10. The resistance value of the resistor R is, for example, not less than 100Ω and not more than 1 MΩ. Otherwise, the configuration of the semiconductor device 4 is similar to the configuration of the semiconductor device 3 according to the third embodiment.

An operation of the semiconductor device according to the embodiment will now be described.

Figure 7:
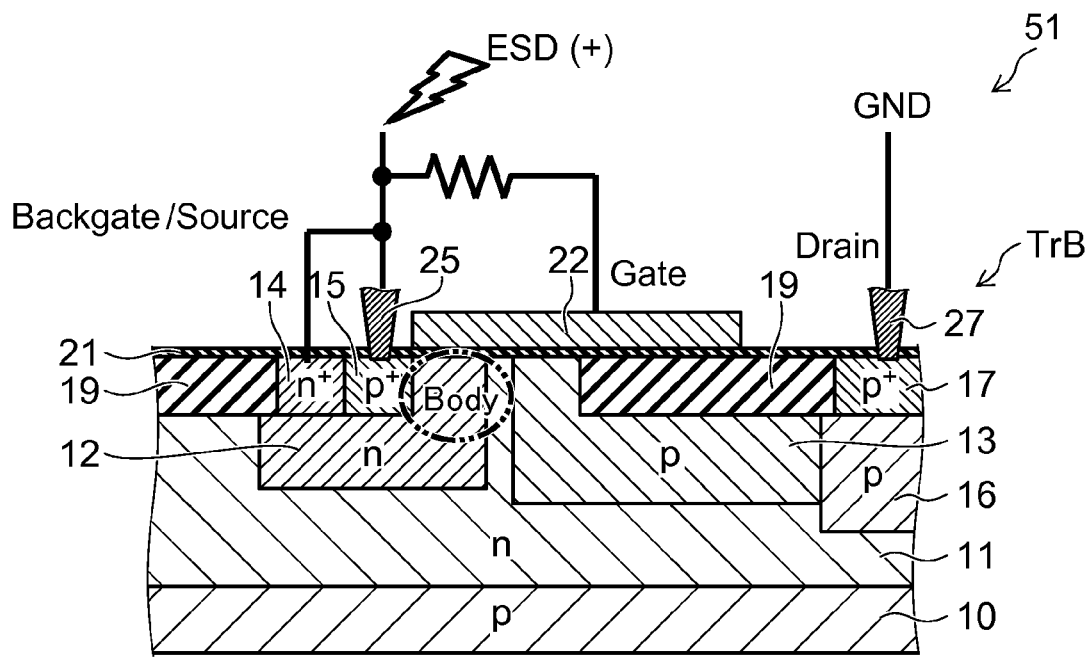
FIG. 7 is a cross-sectional view showing the operation of the semiconductor device according to the fourth embodiment.

FIG. 7 is a cross-sectional view showing the operation of the semiconductor device according to the embodiment.

Figure 8:
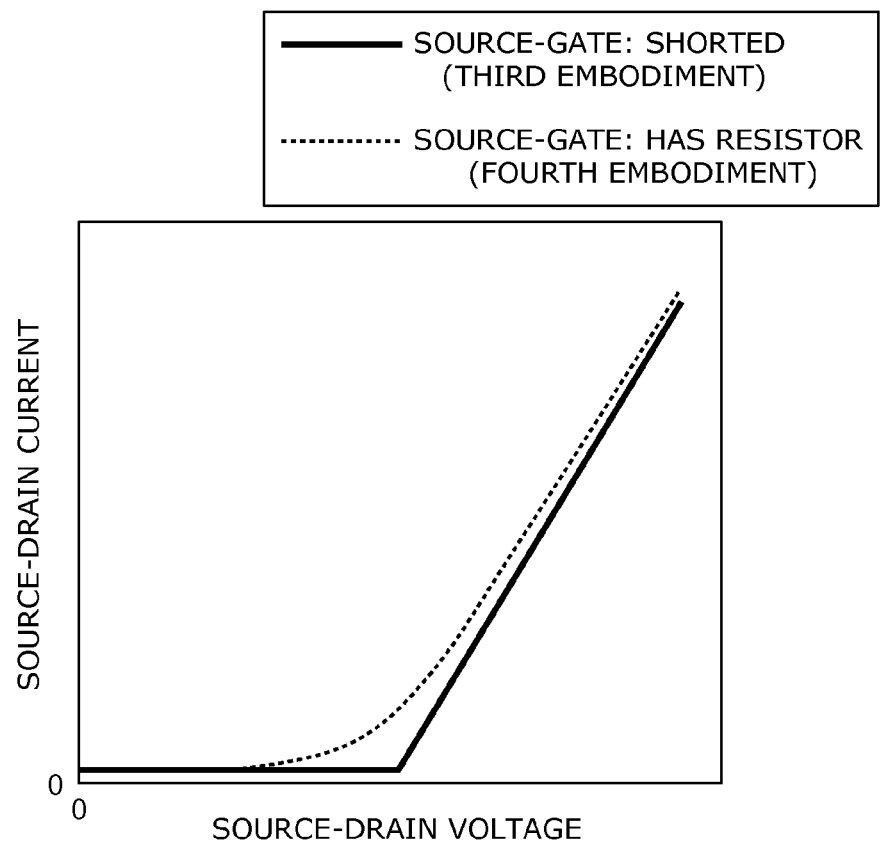
FIG. 8 is a graph of the I-V characteristics of the high ESD protection transistors of the third embodiment and the fourth embodiment, where the horizontal axis is the source-drain voltage, and the vertical axis is the source-drain current.

FIG. 8 is a graph of the I-V characteristics of the high ESD protection transistors of the third embodiment and the fourth embodiment, where the horizontal axis is the source-drain voltage, and the vertical axis is the source-drain current.

When ESD is not applied, the operation of the semiconductor device 4 is similar to the operation of the semiconductor device 3. In other words, the semiconductor device 4 is maintained in the off-state because the power supply potential is continuously applied to the gate electrode 22.

On the other hand, as shown in FIG. 6B and FIG. 7, when positive ESD having a pulse form is applied to the pad D, the ESD flows into the n$^+$-type back gate region 14 and the p$^+$-type source region 15; and the potentials of the deep n-well 11 and the n-type well 12 increase. However, because the resistor R is connected between the pad D and the gate electrode 22, the potential of the gate electrode 22 does not increase very much. Thereby, the potential of the gate electrode 22 decreases relative to the potential of the body region shown in FIG. 7; holes are induced to the portion of the body region contacting the gate insulator film 21; and an inversion layer is formed.

As a result, as shown in FIG. 8, the state of the high ESD protection transistor TrB starts to transition from the off-state to the on-state; and a current starts to flow. Then, the high ESD protection transistor TrB allows more current to flow as the applied ESD voltage increases. Subsequently, the high ESD protection transistor TrB returns to the off-state when the ESD current finishes flowing because the ESD voltage decreases.

Effects of the embodiment will now be described.

In the semiconductor device 4 according to the embodiment as described above, by the gate potential decreasing relative to the body region when ESD is applied, a MOS operation is actively caused to occur; and a channel can be caused to conduct. Thereby, by reliably protecting the internal circuit 50 by reliably allowing the ESD current to flow in the ESD protection element 51 and by allowing the ESD current to flow gradually and uniformly, the concentration of the ESD current is suppressed; and breakdown of the ESD protection element 51 can be prevented.

Otherwise, the operations and the effects of the embodiment are similar to those of the third embodiment described above.

Although examples are illustrated in the embodiments described above in which the value ($L_s/L_{bg}$) of the ratio has two levels, three or more levels may be used. In other words, in the first embodiment, three or more types of DMOS may be provided in which the balance between the on-resistance and the ESD protection characteristics is adjusted. In the second embodiment, the balance between the on-resistance and the ESD protection characteristics may have a gradient of three or more levels inside one transistor region.

Although examples are illustrated in the embodiments described above in which the low on-resistance transistor TrA and the high ESD protection transistor TrB are DMOS, this is not limited thereto; and LDMOS (Laterally Diffused MOS), DEMOS (Drain Extended MOS), EDMOS (Extended Drain MOS (an orthogonal gate Extended Drain MOSFET)), or a high breakdown voltage MOSFET may be used.

Although examples are illustrated in the embodiments described above in which the low on-resistance transistor TrA and the high ESD protection transistor TrB are p-channel transistors, n-channel transistors may be used.

According to the embodiments described above, a semiconductor device having improved ESD protection performance while maintaining a low on-resistance can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
a substrate;
a first transistor provided on the substrate; and
a second transistor provided on the substrate,
each of the first transistor and the second transistor including:
a well of a first conductivity type;
a band-shaped region provided on the well, the band-shaped region extending in a first direction;
a drain region of a second conductivity type provided on the well and separated from the band-shaped region in a second direction perpendicular to the first direction, the drain region extending in the first direction;
a gate electrode provided in a region directly on a region of the well between the band-shaped region and the drain region, the gate electrode extending in the first direction; and
the band-shaped region including:
a back gate region of the first conductivity type, an effective impurity concentration of the back gate region being higher than an effective impurity concentration of the well; and
a source region of the second conductivity type, an effective impurity concentration in the source region being higher than the effective impurity concentration of the well,
the back gate region and the source region being arranged alternately along the first direction in the band-shaped region,
a ratio of a length of the source region along the first direction to a length of the back gate region along the first direction in the band-shaped region of the first transistor being greater than the ratio in the band-shaped region of the second transistor.

2. The semiconductor device according to claim 1, further comprising a pad provided on the substrate and directly connected to the source region of the second transistor.

3. The semiconductor device according to claim 1, wherein the well of the first transistor and the well of the second transistor are separated from each other.

4. The semiconductor device according to claim 1, wherein each of the first transistor and the second transistor further includes:
an insulating film provided between the drain region and the source region, the insulating film contacting the drain region and not contacting the source region; and
a drift region of the second conductivity type connected to the drain region and provided in a region directly under the insulating film, an effective impurity concentration of the drift region being lower than an effective impurity concentration of the drain region.

5. The semiconductor device according to claim 1, wherein the ratio of the first transistor is not less than 1 and not more than 9.

6. The semiconductor device according to claim 1, wherein the ratio of the second transistor is not less than 0.1 but less than 1.

7. The semiconductor device according to claim 1, wherein the source region of the second transistor is connected to the gate electrode of the second transistor.

8. The device according to claim 7, wherein the source region of the second transistor is shorted to the gate electrode of the second transistor.

9. The semiconductor device according to claim 7, wherein the second transistor further includes a resistor connected between the source region and the gate electrode.

10. The semiconductor device according to claim 9, wherein a resistance value of the resistor is not less than 100Ω and not more than 1 MΩ.

11. The semiconductor device according to claim 7, wherein
a first power supply potential is applied to the source region and the back gate region of the second transistor, and
a second power supply potential is applied to the drain region of the second transistor.

12. The semiconductor device according to claim 11, wherein
the source region and the drain region of the second transistor are p-type, and
the first power supply potential is higher than the second power supply potential.

13. The semiconductor device according to claim 1, wherein
the first transistor is disposed at the central portion of a chip, and the second transistor is disposed at the peripheral portion of the chip.

14. The semiconductor device according to claim 1, wherein
the second transistor is near a pad than the first transistor.

15. A semiconductor device, comprising:
a substrate;
a well of a first conductivity type provided on the substrate;
a plurality of band-shaped regions provided on the well, the plurality of band-shaped regions extending in a first direction, the plurality of band-shaped regions being arranged in a second direction perpendicular to the first direction;
a drain region of a second conductivity type provided on the well, disposed between the band-shaped regions, and separated from the band-shaped regions in the second direction, the drain region extending in the first direction;
a gate electrode provided in a region directly on a region of the well between the drain region and the band-shaped regions, the gate electrode extending in the first direction; and
each of the band-shaped regions including:
a back gate region of the first conductivity type, an effective impurity concentration of the back gate region being higher than an effective impurity concentration of the well; and
a source region of the second conductivity type, an effective impurity concentration of the source region being higher than the effective impurity concentration of the well,
the back gate region and the source region being arranged alternately along the first direction in each of the band-shaped regions,
a ratio of a length of the source region along the first direction to a length of the back gate region along the first direction in one of the band-shaped regions being greater than the value of the ratio in other of the band-shaped regions.

16. The semiconductor device according to claim 15, further comprising:
an insulating film provided between the drain region and the source region, the insulating film contacting the drain region and not contacting the source region; and a drift region of the second conductivity type connected to the drain region and provided in a region directly under the insulating film, an effective impurity concentration of the drift region being lower than an effective impurity concentration of the drain region.

17. The semiconductor device according to claim 15, further comprising:
the ratio of the one of the band-shaped regions is not less than 1 and not more than 9.

18. The semiconductor device according to claim 15, further comprising:
the ratio of the other of the band-shaped regions is not less than 0.1 but less than 1.

* * * * *